(12) United States Patent
Satonaka et al.

(10) Patent No.: US 8,313,998 B2
(45) Date of Patent: Nov. 20, 2012

(54) METHOD FOR MANUFACTURING SEMICONDUCTOR DEVICE

(75) Inventors: Tomoya Satonaka, Kanagawa-ken (JP); Katsunori Yahashi, Mie-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 315 days.

(21) Appl. No.: 12/869,058

(22) Filed: Aug. 26, 2010

(65) Prior Publication Data

US 2011/0201167 A1    Aug. 18, 2011

(30) Foreign Application Priority Data

Feb. 15, 2010    (JP) .................................. 2010-30050

(51) Int. Cl.
*H01L 21/336* (2006.01)

(52) U.S. Cl. ................. 438/268; 438/946; 257/E21.423

(58) Field of Classification Search .................... None
See application file for complete search history.

(56) References Cited

U.S. PATENT DOCUMENTS

| | | | | |
|---|---|---|---|---|
| 7,786,020 | B1* | 8/2010 | Kang et al. | 438/734 |
| 7,936,004 | B2* | 5/2011 | Kito et al. | 257/324 |
| 8,222,122 | B2* | 7/2012 | Shin et al. | 438/478 |
| 2009/0283819 | A1 | 11/2009 | Ishikawa et al. | |
| 2011/0309431 | A1* | 12/2011 | Kidoh et al. | 257/324 |

FOREIGN PATENT DOCUMENTS

| | | |
|---|---|---|
| JP | 4-369220 | 12/1992 |
| JP | 8-45906 | 2/1996 |
| JP | 2009-146954 | 7/2009 |
| JP | 2010-27870 | 2/2010 |
| WO | WO 2009/075370 A1 | 6/2009 |

OTHER PUBLICATIONS

Notification of Reason(s) for Refusal issued by the Japanese Patent Office on May 22, 2012, for Japanese Patent Application No. 2010-030050, and English-language translation thereof.
Tanaka et al.; "Bit Cost Scalable Technology with Punch and Plug Process for Ultra High Density Flash Memory", Symp. on VLSI Tech. Dig. pp. 14-15, (2007).
Yahashi; "Semiconductor Device Manufacturing Method and Semiconductor Device", U.S. Appl. No. 12/718,641, filed Mar. 5, 2010.
Ishikawa et al.; "Method for Manufacturing Semiconductor Device", U.S. Appl. No. 12/818,005, filed Jun. 17, 2010.

* cited by examiner

*Primary Examiner* — Benjamin Sandvik
(74) *Attorney, Agent, or Firm* — Finnegan, Henderson, Farabow, Garrett & Dunner, L.L.P.

(57) ABSTRACT

According to one embodiment, a method for manufacturing a semiconductor device is disclosed. The method can include forming a stacked body by alternately stacking a plurality of insulating layers and a plurality of conductive layers above a substrate and forming a resist film above the stacked body. The method can include plasma-etching the insulating layers and the conductive layers by using the resist film as a mask. The method can include forming a hardened layer in an upper surface of the resist film by plasma treatment using a gas containing at least one selected from a group consisting of boron, phosphorus, arsenic, antimony, silicon, germanium, aluminum, gallium, and indium. The method can include slimming a plane size of the resist film by plasma treatment using an oxygen-containing gas in a state where the hardened layer is formed in the upper surface of the resist film.

20 Claims, 8 Drawing Sheets

METHOD FOR MANUFACTURING SEMICONDUCTOR DEVICE

CROSS-REFERENCE TO RELATED APPLICATION

This application is based upon and claims the benefit of priority from Japanese Patent Application No. 2010-030050, filed on Feb. 15, 2010; the entire contents of which are incorporated herein by reference.

FIELD

Embodiments described herein relate generally to a method for manufacturing a semiconductor device.

BACKGROUND

For example, JP-A 2009-146954 proposes a technique to arrange memory cells in a three-dimensional array by forming memory holes in a stacked body having multiple conductive layers and insulating layers alternately stacked therein, the conductive layers serving as control gates in a memory device, and by providing silicon in the memory holes after forming charge storage films on inner walls of the memory holes.

Also, JP-A 2009-146954 discloses the processing of an end portion on a peripheral region side of the stacked body into a staircase pattern by repeating slimming of a resist film and reactive ion etching (RIE) on the stacked body using the resist film as a mask. However, in such a processing method, the resist film is retreated in a width direction and in a film thickness direction during slimming of the resist film. As a result, particularly when the number of layers in the stacked body is increased, there is a risk that the resist film is retreated in thickness, and eventually is completely removed.

DETAILED DESCRIPTION

According to one embodiment, a method for manufacturing a semiconductor device is disclosed. The method can include forming a stacked body by alternately stacking a plurality of insulating layers and a plurality of conductive layers above a substrate and forming a resist film above the stacked body. The method can include plasma-etching the insulating layers and the conductive layers by using the resist film as a mask. The method can include forming a hardened layer in an upper surface of the resist film by plasma treatment using a gas containing at least one selected from a group consisting of boron, phosphorus, arsenic, antimony, silicon, germanium, aluminum, gallium, and indium. The hardened layer contains at least one selected from the group consisting of the boron, the phosphorus, the arsenic, the antimony, the silicon, the germanium, the aluminum, the gallium, and the indium. The method can include slimming a plane size of the resist film by plasma treatment using an oxygen-containing gas in a state where the hardened layer is formed in the upper surface of the resist film.

Embodiments will be described below with reference to the drawings.

Figure 1:
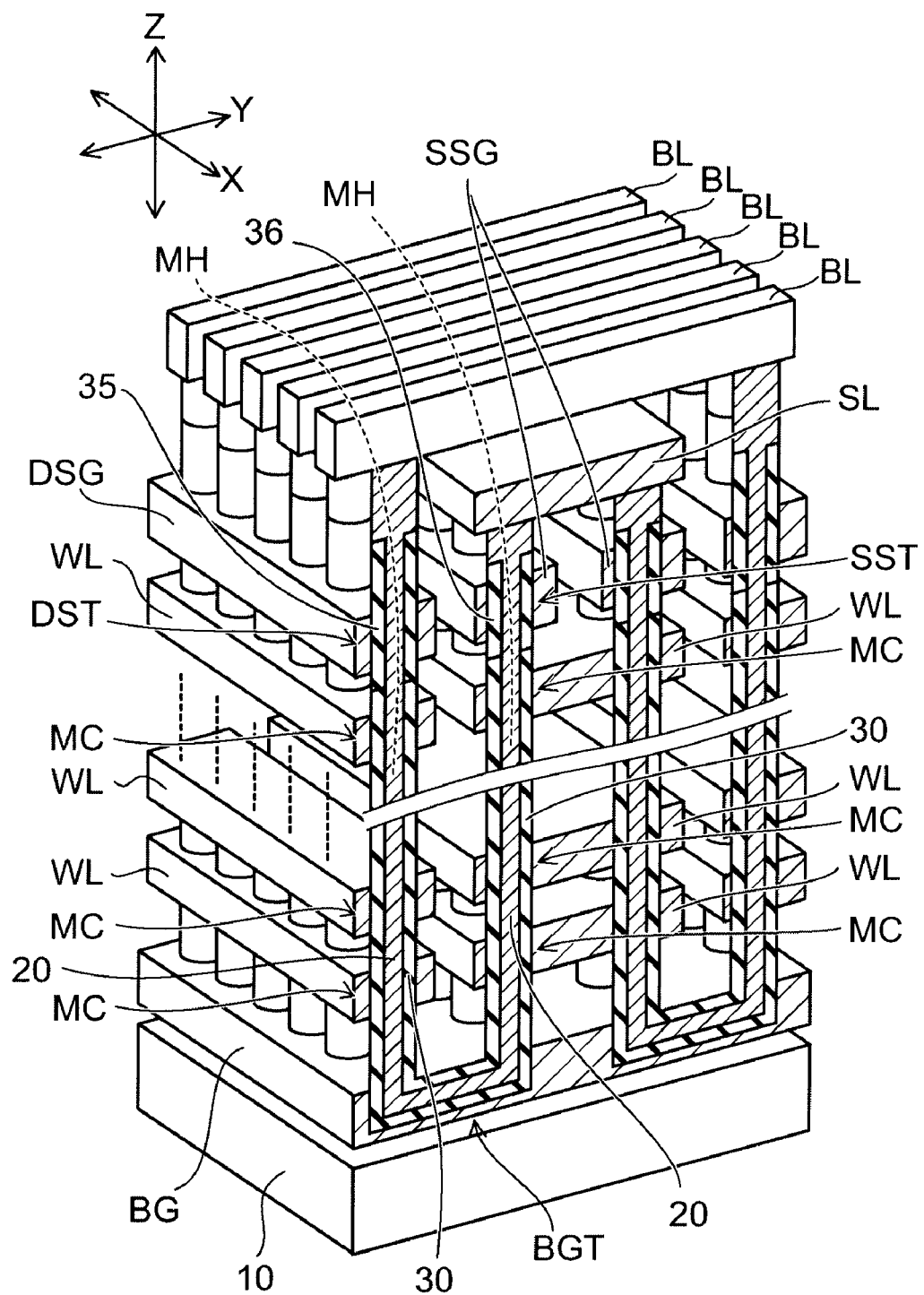
FIG. 1 is a schematic perspective view of a memory cell array in a semiconductor device according to an embodiment.

FIG. 1 shows an example of a configuration of a memory cell array in a semiconductor device according to this embodiment. Note that, for simplicity of the figure, an insulating portion other than an insulating film formed inside each memory hole MH is not shown in FIG. 1. Although silicon is illustrated as an example of a semiconductor in the following embodiment, any semiconductor may be used besides silicon.

Also, in this specification, an XYZ orthogonal coordinate system is introduced for convenience of description. In this coordinate system, two mutually orthogonal directions parallel to a principal surface of a substrate 10 are defined as an X-direction and a Y-direction. A direction orthogonal to both the X-direction and the Y-direction is defined as a Z-direction. Multiple conductive layers WL are stacked in the Z-direction.

A back gate BG is provided above the substrate 10 with an insulating layer (not shown) interposed therebetween. The back gate BG is, for example, a conductive silicon layer having impurities added thereto. On the back gate BG, the multiple conductive layers WL and insulating layers (not shown) are alternately stacked. The conductive layers WL are, for example, conductive silicon layers having impurities added thereto.

The conductive layers WL are divided into multiple blocks by slits extending in the X-direction. A drain-side selection gate DSG is provided over the uppermost conductive layer WL in a certain block with an insulating layer (not shown) interposed therebetween. The drain-side selection gate DSG is, for example, a conductive silicon layer having impurities added thereto. In another block adjacent to the certain block, a source-side selection gate SSG is provided over the uppermost conductive layer WL with an insulating layer (not shown) interposed therebetween. The source-side selection gate SSG is, for example, a conductive silicon layer having impurities added thereto.

A source line SL is provided over the source-side selection gate SSG with an insulating layer (not shown) interposed therebetween. The source line SL is, for example, a conductive silicon layer having impurities added thereto. Alternatively, a metal material may be used as the source line SL. Multiple bit lines BL are provided over the source line SL and the drain-side selection gate DSG with an insulating layer (not shown) interposed therebetween. The bit lines BL extend in the Y-direction.

The multiple U-shaped memory holes MH are formed in the above-described stacked body above the substrate 10. In the block including the drain-side selection gate DSG, a hole is formed extending in the Z-direction and piercing the drain-side selection gate DSG and the conductive layers WL thereunder. In the block including the source-side selection gate SSG, a hole is formed extending in the Z-direction and piercing the source-side selection gate SSG and the conductive layers WL thereunder. Both holes communicate with each other via a hole formed in the back gate BG and extending in the Y-direction.

In each of the memory holes MH, a channel body 20 is provided as a U-shaped silicon layer. A gate insulating film 35 is formed on a side wall of the memory hole MH in a portion between the drain-side selection gate DSG and the channel body 20. A gate insulating film 36 is formed on a side wall of the memory hole MH in a portion between the source-side selection gate SSG and the channel body 20.

An insulating film 30 is formed on a side wall of the memory hole MH in a portion between the channel body 20 and each of the conductive layers WL. The insulating film 30 is also formed on an inner wall of the memory hole MH in a portion between the back gate BG and the channel body 20. The insulating film 30 has, for example, an oxide-nitride-oxide (ONO) structure with a silicon nitride film sandwiched between a pair of silicon oxide films.

Figure 2:
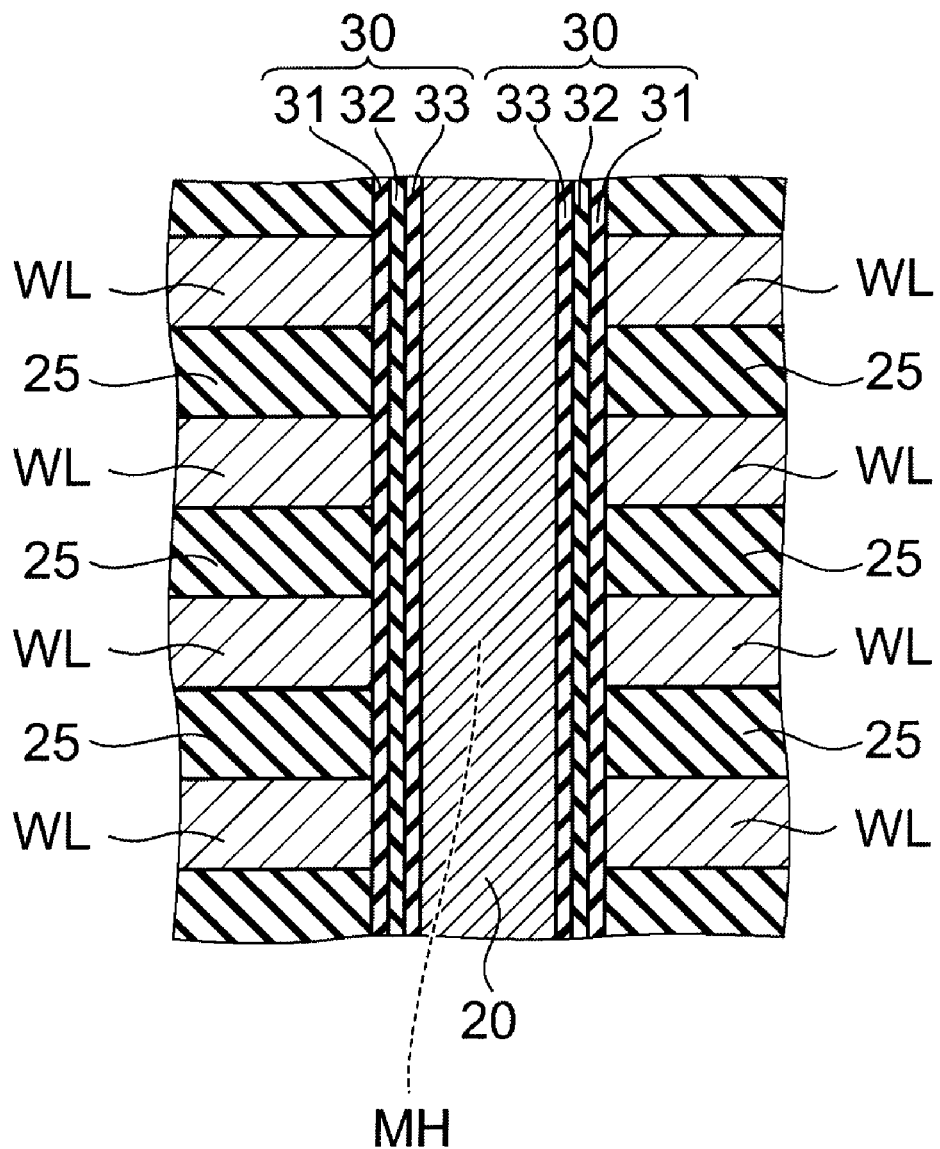
FIG. 2 is an enlarged cross-sectional view of the relevant part of the memory cell array.

FIG. 2 shows an enlarged cross-section of a portion where the channel body 20 penetrates the multiple conductive layers WL and interlayer insulating layers 25. In FIG. 2, insulating layers between the conductive layers WL, which are omitted in FIG. 1, are shown as the insulating layers 25.

Between the conductive layers WL and the channel body 20, a first insulating film 31, a charge storage film 32, and a second insulating film 33 are provided in this order from the conductive layer WL side. The first insulating film 31 is in contact with the conductive layers WL, and the second insulating film 33 is in contact with the channel body 20. The charge storage film 32 is provided between the first insulating film 31 and the second insulating film 33.

The channel body 20 functions as a channel. The conductive layers WL function as control gates. The charge storage film 32 functions as a data storage layer to store charges injected from the channel body 20. In other words, a memory cell is formed at the intersection of the channel body 20 and each of the conductive layers WL. The memory cell has a structure in which the channel is surrounded by the control gates.

The semiconductor device according to this embodiment is a nonvolatile semiconductor memory device capable of freely performing the electrical erasing and writing of data and retaining the stored contents even when the power is turned off. For example, the memory cell has a charge trap structure. The charge storage film 32 has many traps that trap charges (electrons) and is, for example, a silicon nitride film. The second insulating film 33 is, for example, a silicon oxide film and serves as a potential barrier when charges are injected from the channel body 20 into the charge storage film 32 or when the charges stored in the charge storage film 32 diffuse into the channel body 20. The first insulating film 31 is, for example, a silicon oxide film and prevents the charges stored in the charge storage film 32 from diffusing into the conductive layers WL.

Referring again to FIG. 1, a drain-side selection transistor DST consists of the drain-side selection gate DSG, the channel body 20 punched through the drain-side selection gate DSG and the gate insulating film 35 provided between the channel body 20 and the drain-side selection gate DSG. An upper end portion of the channel body 20 protruding above the drain-side selection gate DSG is connected to the corresponding bit line BL.

A source-side selection transistor SST consists of the source-side selection gate SSG, the channel body 20 punched through the source-side selection gate SSG and the gate insulating film 36 provided between the channel body 20 and the source-side selection gate SSG. An upper end portion of the channel body 20 protruding above the source-side selection gate SSG is connected to the source line SL.

A back gate transistor BGT consists of the back gate BG, the channel body 20 provided in the back gate BG and the insulating film 30 between the back gate BG and the channel body 20.

Between the drain-side selection transistor DST and the back gate transistor BGT, multiple memory cells MC, each having the conductive layer WL as the control gate, are provided corresponding to the number of the conductive layers WL.

Similarly, between the back gate transistor BGT and the source-side selection transistor SST, multiple memory cells MC, each having the conductive layer WL as the control gate, are provided corresponding to the number of the conductive layers WL.

The memory cells MC, the drain-side selection transistor DST, the back gate transistor BGT, and the source-side selection transistor SST are connected in series to form a U-shaped memory string. By arranging such memory strings in the X-direction and the Y-direction, the multiple memory cells MC are three-dimensionally provided in the X-direction, the Y-direction, and the Z direction.

Figure 3:
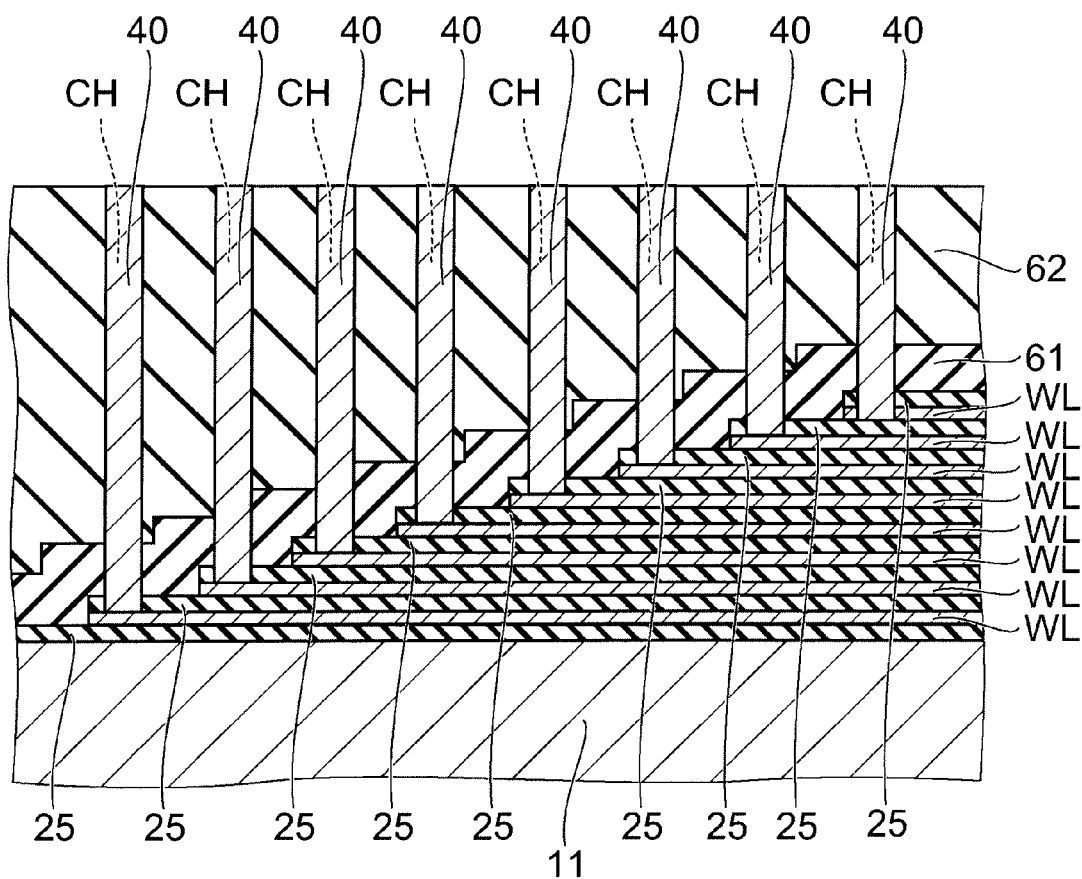
FIG. 3 is a schematic cross-sectional view of a staircase structure in the semiconductor device according to the embodiment.

Next, FIG. 3 shows a cross section structure of a contact region for connecting the conductive layers WL to upper wiring (not shown). This contact region is at the outer side in the X-direction of the memory cell array region shown in FIG. 1.

The stacked body including the multiple conductive layers WL and insulating layers 25 is partially processed into a staircase pattern in the contact region. The staircase structure is covered with a stopper layer 61, and an interlayer insulating layer 62 is provided on the stopper layer 61. For example, the stopper layer 61 is made of silicon nitride, and the interlayer insulating layer 62 is made of silicon oxide.

Multiple contact holes CH are formed in the interlayer insulating layer 62 and the stopper layer 61, and contact electrodes 40 are provided in the contact holes CH, respectively.

Each of the contact holes CH is punched through the interlayer insulating layer 62, the stopper layer 61 and the insulating layer 25, and reaches the conductive layer WL at the corresponding step. As the contact electrode 40, tungsten, for example, is buried in the contact hole CH. Each of the conductive layers WL is connected to the upper wiring (not shown) via the corresponding contact electrode 40.

Next, with reference to FIGS. 4A to 8B, a method for forming a staircase structure is described.

Figure 4A:
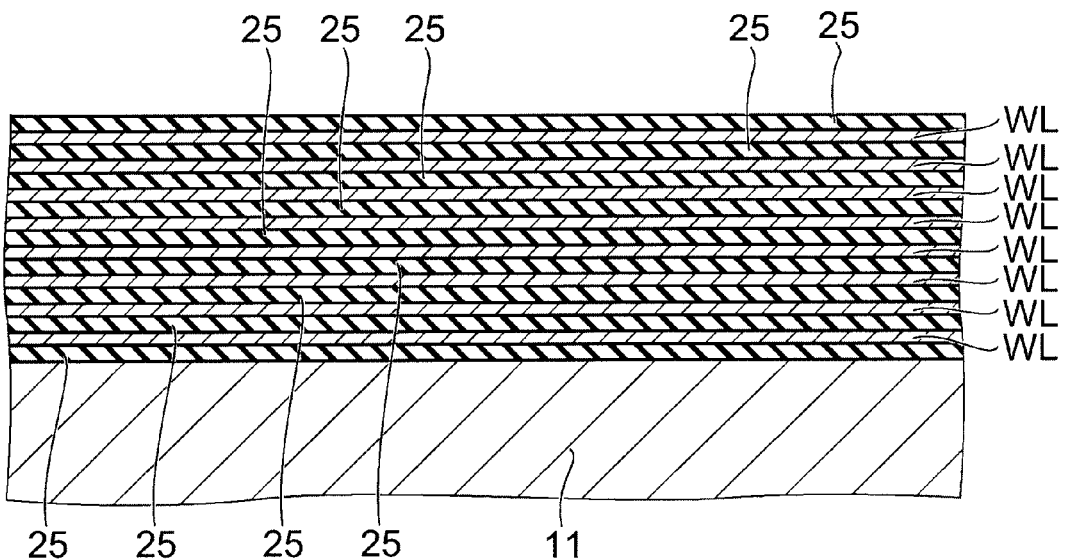
FIG. 4A to FIG. 8B are schematic cross-sectional views showing a forming method for the staircase structure.

First, as shown in FIG. 4A, multiple insulating layers 25 and multiple conductive layers WL are alternately stacked on a base 11 to form a stacked body. Although FIG. 4A illustrates eight conductive layers WL as an example, the number of the conductive layers WL is arbitrary.

Here, the base 11 includes the substrate 10, the back gate BG, their interlayer insulating layers and the like in FIG. 1. In the back gate BG in the memory cell array region, a concave portion corresponding to the bottom of a U-shaped memory string is formed before formation of the stacked body including the insulating layers 25 and the conductive layers WL. To be more specific, the back gate BG is formed on the substrate 10 shown in FIG. 1, and the concave portion is formed in the back gate BG. Then, after burying a sacrificial film in the concave portion, the insulating layers 25 and the conductive layers WL are sequentially stacked.

The insulating layers 25 are silicon oxide layers mainly containing silicon oxide, and the conductive layers WL are silicon layers (e.g., polycrystalline silicon layers) mainly containing silicon. The insulating layers 25 and the conductive layers WL are formed by, for example, chemical vapor deposition (CVD).

After the stacked body is formed, processes of forming memory cells MC, a drain-side selection transistor DST, a source-side selection transistor SST, a back gate transistor BGT, and the like are performed in the memory cell array region.

After the stacked body is formed, multiple holes are formed, which are punched through the stacked body in a vertical direction (stacking direction) and reach the sacrificial film buried in the concave portion of the back gate BG. In FIG. 1, two holes are formed for each concave portion. The sacrificial film buried in the concave portion is removed through the holes. Thus, the concave portion and a pair of adjacent holes extending in the vertical direction are connected to each other to form a U-shaped memory hole MH. An insulating film 30 including a charge storage film 32 is formed on an inner wall of the memory hole MH, and a silicon layer to serve as a channel body 20 is formed in the memory hole MH.

After the memory cell array is formed, a process for a contact region is performed as described below.

Figure 4B:
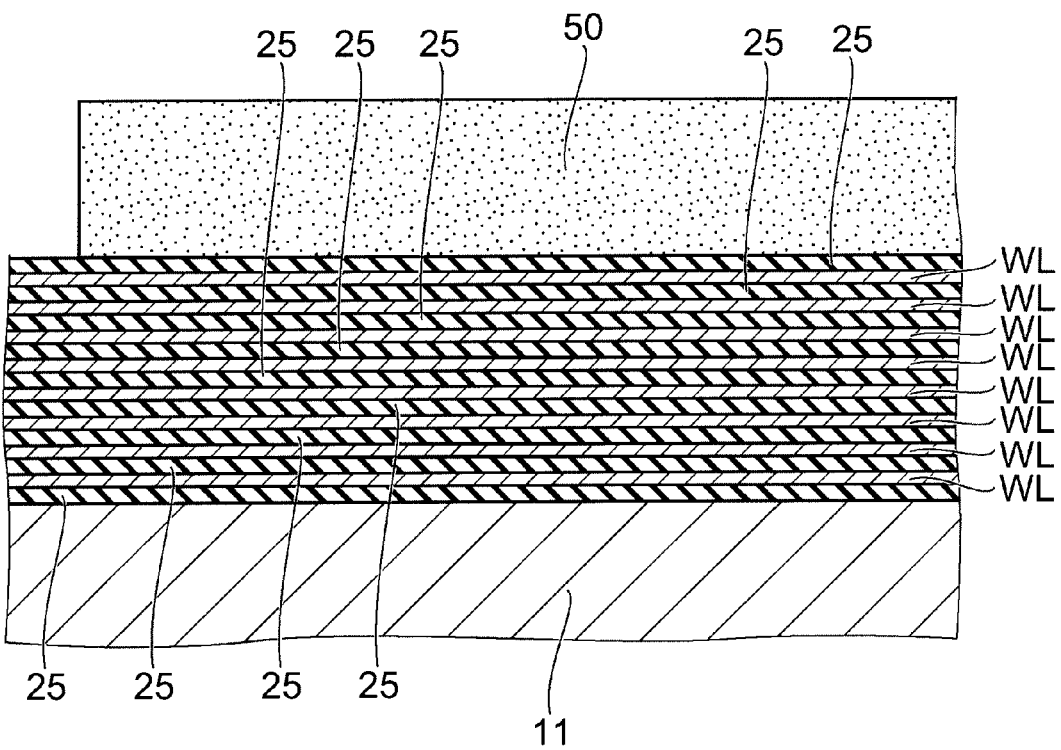

First, as shown in FIG. 4B, a resist film 50 is formed on the stacked body. In the case of FIG. 4B, the resist film 50 is formed on the uppermost insulating layer 25, for example.

Then, the resist film 50 is subjected to lithography and development using a mask (not shown) and is thus patterned so that an edge of the resist film 50 may be located at a desired position.

Figure 5A:
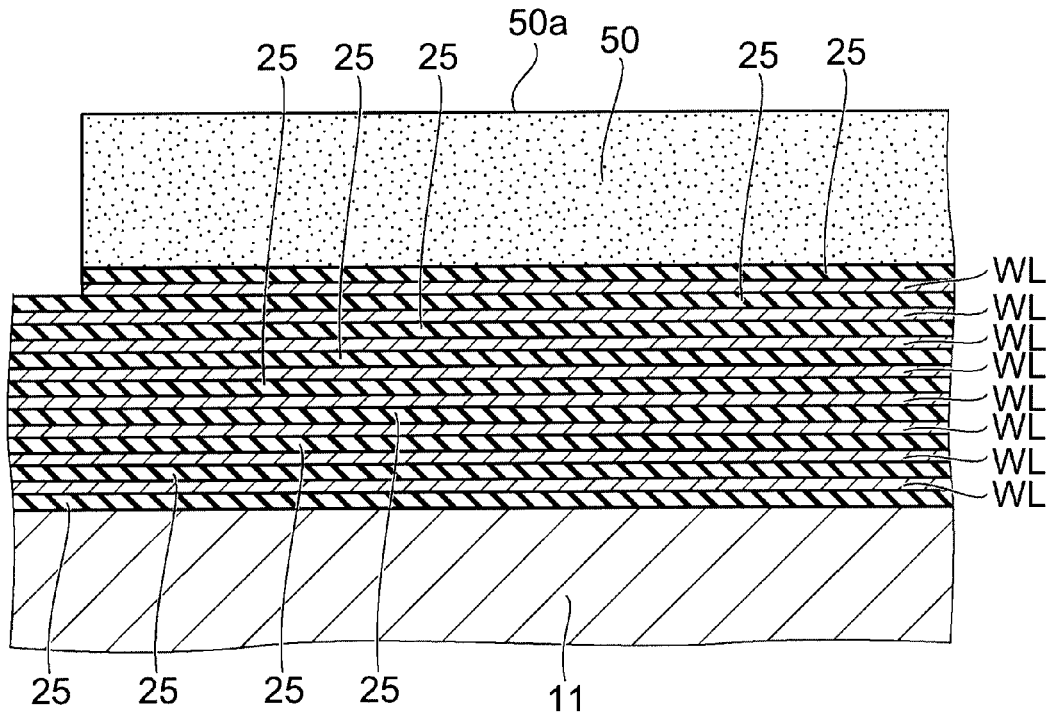

Thereafter, reactive ion etching (RIE) is performed using the resist film 50 as a mask, thereby removing one insulating layer 25 and one conductive layer WL therebelow, which are exposed from the resist film 50 (FIG. 5A).

For example, an inductively coupled plasma (ICP) type plasma treatment apparatus is used. A wafer having the stacked body formed thereon is placed in a chamber, and the inside of the chamber is set at a desired reduced-pressure atmosphere.

In etching the insulating layer 25 made of, for example, tetraethoxysilane (TEOS), a $CHF_3$ gas is introduced into the chamber. During etching of the insulating layer 25, plasma is generated in the chamber by applying power to an upper antenna of the ICP type plasma treatment apparatus, and high-frequency power is applied to the base 11 (or the substrate 10). To be more specific, high-frequency power is applied to a holder which holds the wafer in the chamber.

In etching the conductive layer WL made of, for example, polycrystalline silicon, a Br gas and an $O_2$ gas are introduced into the chamber. Also during etching of the conductive layer WL, plasma is generated in the chamber by applying power to the upper antenna, and high-frequency power is applied to the base 11.

Figure 5B:
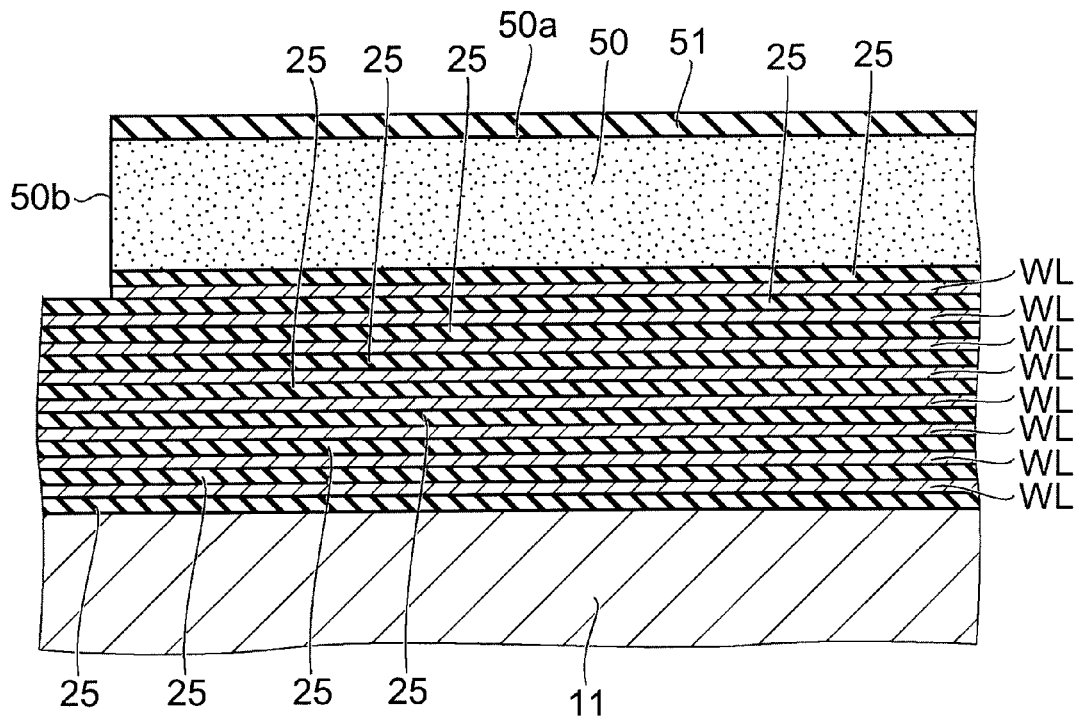

After plasma etching of the insulating layer 25 and the conductive layer WL, a hardened layer 51 shown in FIG. 5B is formed in the same chamber. The hardened layer 51 is formed by plasma treatment using a gas containing at least one selected from a group consisting of boron (B), phosphorus (P), arsenic (As), antimony (Sb), silicon (Si), germanium (Ge), aluminum (Al), gallium (Ga), and indium (In).

For example, a $BCl_3$ gas is introduced into the chamber, power is applied to the upper antenna, and thus plasma is generated in the chamber. Accordingly, boron (B) obtained by decomposition of $BCl_3$ is injected into an upper surface 50a of the resist film 50. In this event, high-frequency power is applied to the base 11, and boron is accelerated with directivity in the vertical direction toward the base 11 and is injected into the upper surface 50a of the resist film 50. Therefore, very little boron is injected into a side surface 50b of the resist film 50, and thus the hardened layer 51 is hardly formed in the side surface 50b of the resist film 50. Note that injection of boron into the insulating layer 25 exposed from the resist film 50 does not cause any problem.

The resist film 50 is made of an organic material containing, for example, carbon (C). By injecting boron (B) into the resist film 50, the hardened layer 51 is formed having a bond of C and B on the upper surface 50a of the resist film 50.

Subsequently, in the state where the hardened layer 51 is formed in the upper surface 50a, slimming to reduce the plane size of the resist film 50 is performed by isotropic plasma etching. This process is also successively performed in the same chamber. For example, an oxygen ($O_2$) gas and a chlorine ($Cl_2$) gas are introduced into the chamber, power is applied to the upper antenna, and thus plasma is generated in the chamber. During slimming of the resist film 50, no power is applied to the base 11 and the holder which holds the base 11 is grounded. Therefore, the resist film 50 is isotropically etched.

Figure 6A:
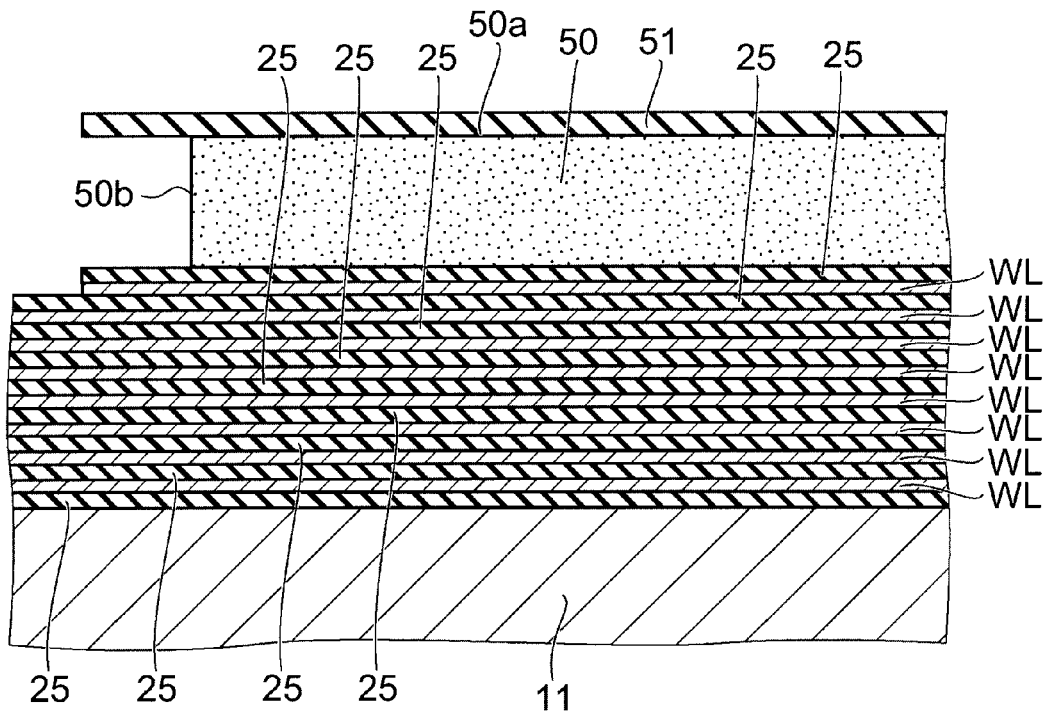

However, in this embodiment, the hardened layer 51 formed in the upper surface 50a of the resist film 50 can suppress consumption of the resist film 50 in a film thickness direction. With respect to etching conditions during the resist slimming, the hardened layer 51 has a lower etching rate and higher etching resistance than the resist film 50. For example, the hardened layer 51 has etching resistance about 30 times higher than that of the resist film 50. Therefore, as shown in FIG. 6A, selective etching of the resist film 50 proceeds in the planar direction (horizontal direction), and thus the position of the side surface 50b of the resist film 50 is changed.

Subsequently, the hardened layer 51 is removed by plasma etching in the same chamber. For example, an oxygen ($O_2$) gas is introduced into the chamber, power is applied to the upper antenna, and thus plasma is generated in the chamber. In this event, high-frequency power is applied to the base 11. By applying power to the base 11, removal of the hardened layer 51 proceeds directionally in the film thickness direction. Thus, lateral etching of the resist film 50 can be suppressed.

Figure 6B:
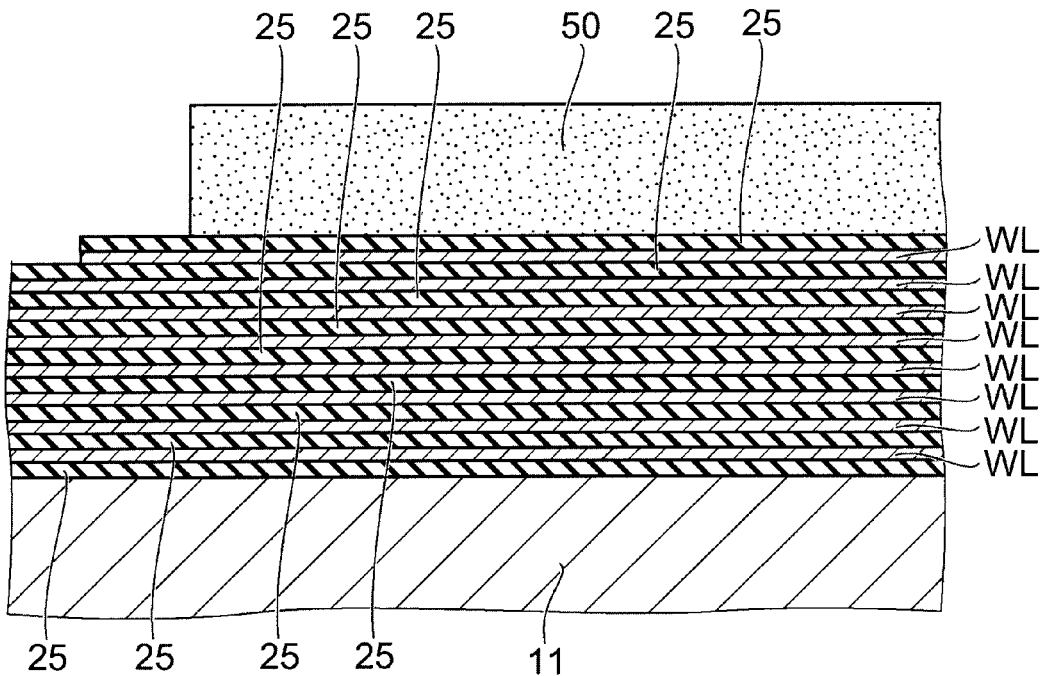

As shown in FIG. 6B, the resist slimming additionally exposes a part of the surface of the uppermost insulating layer 25. Then, plasma etching is performed using the slimmed resist film 50 as a mask, thereby removing again one insulating layer 25 and one conductive layer WL, which are exposed from the resist film 50. Etching conditions for the plasma etching here are the same as those described above.

Figure 7A:
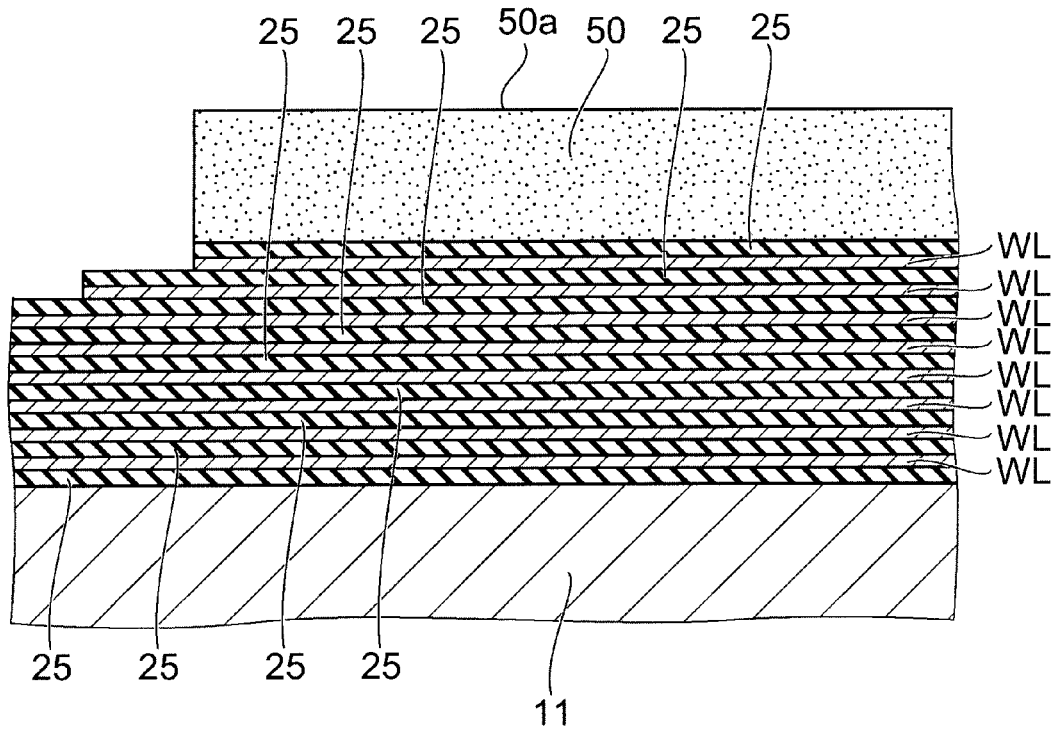

Accordingly, as shown in FIG. 7A, the insulating layer 25 below the portion removed by the previous etching and the conductive layer WL therebelow (the second conductive layer WL from the top) are removed. Moreover, the insulating layer 25 exposed from the resist film 50 in a portion adjacent to the removed portion and the conductive layer WL therebelow (the first conductive layer WL from the top) are also removed.

Figure 7B:
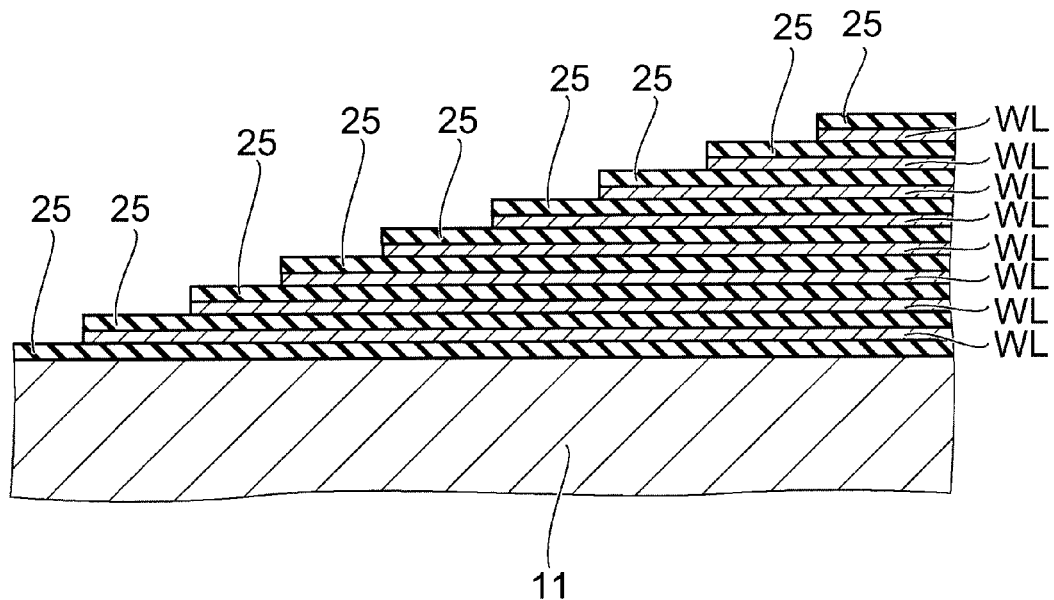

Thereafter, the respective processes described above are repeated. In other words, formation of the hardened layer 51 in the upper surface 50a of the resist film 50, further slimming of the resist film 50 in the state where the hardened layer 51 is formed, and etching of the insulating layer 25 and the conductive layer WL by using the slimmed resist film 50 as a mask are repeated more than once. Thus, a staircase structure shown in FIG. 7B is obtained.

During slimming of the resist film 50, isotropic etching is performed since etching proceeds in the planar direction (horizontal direction) to reduce the plane size of the resist film 50. The resist film 50 is sometimes etched also in the vertical direction (film thickness direction) for about the same amount as that in the horizontal direction. For this reason, particularly when the stacked body includes more layers and the number of steps in the staircase structure is increased, the number of times of resist slimming is also increased. This may cause a situation where the resist film 50 is completely consumed in the film thickness direction during the slimming. In such a case, the resist film 50 needs to be patterned by conveying the wafer to an exposure apparatus and a development apparatus during processing of the staircase structure, forming again a resist film 50, and then subjecting the resist film 50 to lithography and development.

On the other hand, in this embodiment, the hardened layer 51 is formed in the upper surface 50a of the resist film 50 before resist slimming in the same chamber as that used for processing of the staircase structure. The hardened layer 51 suppresses consumption of the resist film 50 in the film thickness direction during resist slimming. As a result, the resist film 50 can be left on the stacked body until processing of all the steps is completed. Thus, another resist film 50 need not be formed and patterned.

The high etching resistance of the hardened layer 51 results from a bond of carbon (C) contained in the resist film 50 and boron (B) injected thereinto. Although a $BCl_3$ gas is illustrated as an example of a raw material gas for forming the hardened layer 51 in the above embodiment, a $BF_3$ gas may be used to inject B into the upper surface 50a of the resist film 50. Note that since chlorine (Cl) is less likely to react with carbon (C) than fluorine (F), use of a $BCl_3$ gas facilitates bonding of C and B. Moreover, a compound CFx of carbon with fluorine is more likely to volatilize than a compound CClx of carbon with chlorine. Therefore, as the raw material gas for forming the hardened layer 51, a $BCl_3$ gas containing Cl, for example, is preferable to a gas containing F.

Note that not only boron (B) but also phosphorus (P), arsenic (As), antimony (Sb), silicon (Si), germanium (Ge), aluminum (Al), gallium (Ga), or indium (In) may be injected into the resist film 50, and the hardened layer 51 may be formed having a P—C bond, As—C bond, Sb—C bond, Si—C bond, Ge—C bond, Al—C bond, Ga—C bond or In—C bond. Two or more kinds of elements among the above elements may be injected into the resist film 50. At least one kind of element among the above elements has only to be injected into the resist film 50.

Also in the case of using any of the above elements, as in the case of using B, a hardened layer 51 having etching resistance higher than that of the resist film 50 can be formed on the upper surface 50a of the resist film 50 during resist slimming. Thus, consumption of the resist film 50 in the film thickness direction can be suppressed.

For example, $PH_3$ or $PF_3$ can be used as a raw material gas containing P; $AsH_3$ can be used as a raw material gas containing As; $SbH_3$ can be used as a raw material gas containing Sb; $SiH_4$, $SiCl_4$, or $SiF_4$ can be used as a raw material gas containing Si; $GeH_4$, $GeCl_4$, or $GeH_4$ can be used as a raw material gas containing Ge; trimethylgallium (TMG), $GaCl_3$, or $GaF_3$ can be used as a raw material gas containing Ga; trimethylaluminum (TMA) can be used as a raw material gas containing Al; trimethylindium (TMI) or $InCl_3$ can be used as a raw material gas containing In.

When the gas containing the silicon (Si) is used as the raw material gas for forming the hardened layer 51, the $SiCl_4$ gas is preferable to the $SiF_4$ gas. The $SiCl_4$ gas facilitates bonding of the carbon (C) contained in the resist film 50 and the silicon (Si) since the chlorine (Cl) is less likely to react with the carbon (C) than the fluorine (F). Moreover, the compound CFx is more likely to volatilize than the compound CClx.

An ion injection method is also conceivable as a method for injecting B, P, As, Sb, Si, Ge, Al, Ga, In, or the like into the resist film 50. However, the ion injection method is not efficient since it results in the need to repeatedly convey the wafer between an ion injection apparatus and the chamber of the plasma treatment apparatus for etching the stacked body and slimming the resist film 50.

In this embodiment, formation of the hardened layer 51, slimming of the resist film 50, removal of the hardened layer 51, and etching of the insulating layer 25 and the conductive layer WL are performed while the reduced-pressure atmosphere is maintained in the same chamber by changing the kinds of gas to be introduced, flow rates, power to be applied, and the like. This enables efficient processing.

In the above embodiment, the hardened layer 51 is removed in a separate process by introducing a different gas from that used in etching of the insulating layer 25 and the conductive layer WL. But the same gas as that used in etching of the insulating layer 25 and the conductive layer WL may be used to remove the hardened layer 51 simultaneously with the etching. Note that higher processing accuracy for the staircase structure is likely to be achieved when the insulating layer 25 and the conductive layer WL are etched after the hardened layer 51 is completely removed.

Figure 8A:
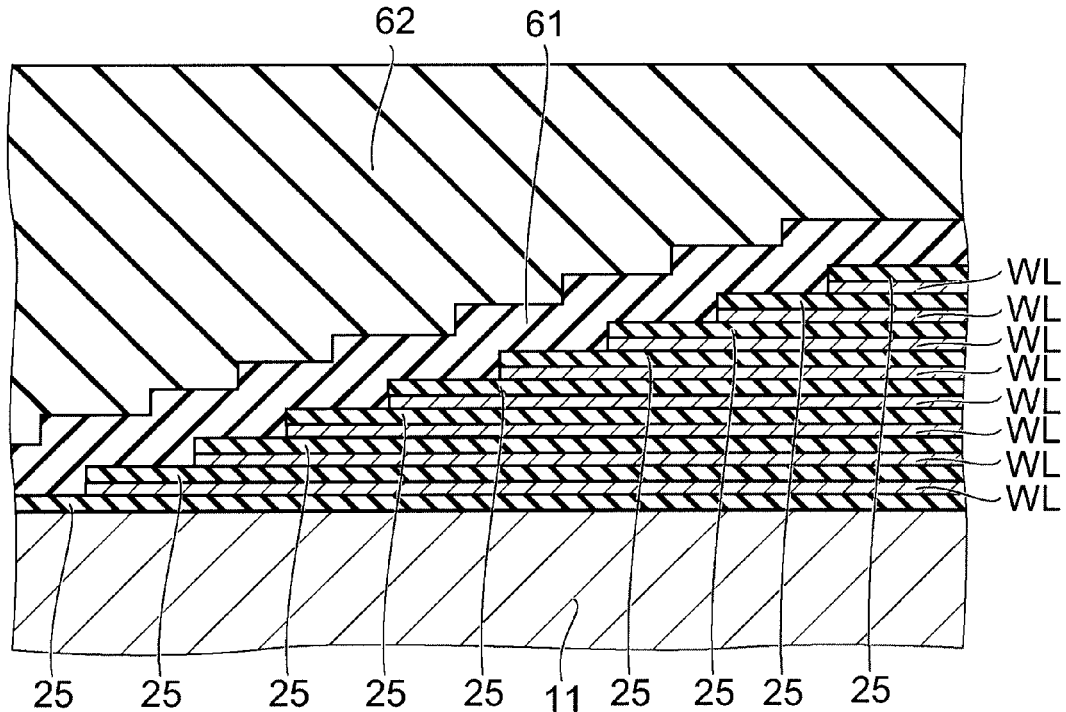

After the staircase structure is formed, a stopper layer 61 is formed so as to cover the staircase structure as shown in FIG. 8A. The stopper layer 61 is made of, for example, silicon nitride. Thereafter, an interlayer insulating layer 62 is formed on the stopper layer 61. The interlayer insulating layer 62 is made of, for example, silicon oxide, which is a different material from that of the stopper layer 61.

Subsequently, after an upper surface of the interlayer insulating layer 62 is flattened, a mask (not shown) is formed thereon, and the interlayer insulating layer 62, the stopper layer 61, and the insulating layer 25 just below the stopper layer 61 are selectively etched using the mask.

Figure 8B:
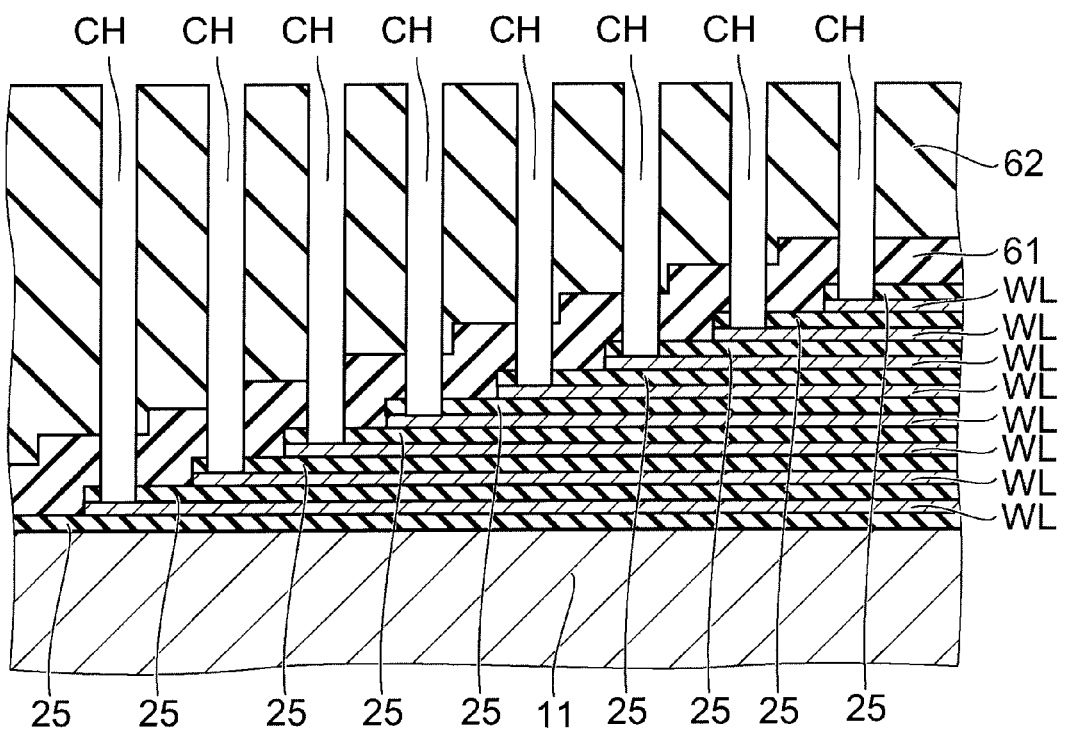

Thus, as shown in FIG. 8B, multiple contact holes CH are formed in the interlayer insulating layer 62, the stopper layer 61, and the insulating layer 25 just below the stopper layer 61. The multiple contact holes CH are different from each other in depth from the upper surface of the interlayer insulating layer 62. Each of the contact holes CH is punched through the interlayer insulating layer 62, the stopper layer 61, and the insulating layer 25 just below the stopper layer 61, and reaches the conductive layer WL at the corresponding step.

The multiple contact holes CH are formed all at once by reactive ion etching (RIE). Processing the multiple conductive layers WL into a staircase pattern is efficient since the multiple contact holes CH reaching the respective conductive layers WL can be formed all at once by the same etching process. In this event, the stopper layer 61 made of silicon nitride functions as an etching stopper during etching of the interlayer insulating layer 62 made of silicon oxide.

After the contact holes CH are formed, contact electrodes 40 are provided therein as shown in FIG. 3. To be more specific, a first barrier film (e.g., a titanium film) is formed on an inner wall of each of the contact holes CH. Thereafter, a second barrier film (e.g., a titanium nitride film) is formed on the first barrier film, and then tungsten excellent in burying properties, for example, is buried on the inner side of the second barrier film. The first and second barrier films prevent diffusion of tungsten (W). Moreover, the first and second barrier films also function as adhesion layers which adhere to both the inner wall of the contact hole CH and tungsten.

The shape of the memory string is not limited to the U-shape but may be an I-shape linearly extending in the stacking direction of the multiple conductive layers WL. Also, the insulating film structure between the conductive layer WL and the channel body 20 is not limited to the oxide-nitride-oxide (ONO) structure but may be, for example, a two-layer structure including a charge storage layer and a gate insulating film.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

The invention claimed is:

1. A method for manufacturing a semiconductor device, comprising:
   forming a stacked body by alternately stacking a plurality of insulating layers and a plurality of conductive layers above a substrate;
   forming a resist film above the stacked body;
   plasma-etching the insulating layers and the conductive layers by using the resist film as a mask;
   forming a hardened layer in an upper surface of the resist film by plasma treatment using a gas containing at least one selected from a group consisting of boron, phosphorus, arsenic, antimony, silicon, germanium, aluminum, gallium, and indium, the hardened layer containing at least one selected from the group consisting of the boron, the phosphorus, the arsenic, the antimony, the silicon, the germanium, the aluminum, the gallium, and the indium; and
   slimming a plane size of the resist film by plasma treatment using an oxygen-containing gas in a state where the hardened layer is formed in the upper surface of the resist film.

2. The method according to claim 1, wherein
   the resist film contains carbon, and
   the hardened layer has a bond of the carbon and at least one element selected from the group consisting of the boron, the phosphorus, the arsenic, the antimony, the silicon, the germanium, the aluminum, the gallium, and the indium.

3. The method according to claim 1, wherein
   the hardened layer is formed in a state where electric power is applied to the substrate.

4. The method according to claim 1, wherein
   the hardened layer is formed by plasma treatment using a BCl$_3$ gas or a SiCl$_4$ gas.

5. The method according to claim 1, wherein
   the resist film is slimmed under a condition that an etching rate of the resist film is set higher than an etching rate of the hardened layer.

6. The method according to claim 1, wherein
   the forming of the hardened layer, the slimming of the resist film, and the plasma-etching of the insulating layers and the conductive layers are performed in one chamber while a reduced-pressure atmosphere is maintained in the chamber.

7. The method according to claim 1, further comprising removing the hardened layer after slimming the resist film, the insulating layers and the conductive layers being plasma-etched using the slimmed resist film as a mask after the hardened layer is removed.

8. The method according to claim 7, wherein
   the hardened layer is removed by plasma treatment using an oxygen-containing gas.

9. The method according to claim 8, wherein
   the hardened layer is removed in a state where electric power is applied to the substrate.

10. The method according to claim 7, wherein
    the forming of the hardened layer, the slimming of the resist film, the removing of the hardened layer, and the plasma-etching of the insulating layers and the conductive layers are performed in one chamber while a reduced-pressure atmosphere is maintained in the chamber.

11. The method according to claim 1, wherein
    the insulating layers and the conductive layers are plasma-etched using the slimmed resist film as a mask.

12. The method according to claim 11, wherein
    when the insulating layers and the conductive layers are etched, the hardened layer is removed using an identical gas to a gas used for etching the insulating layers and the conductive layers.

13. The method according to claim 1, wherein
    the resist film is slimmed in a state where the substrate is grounded.

14. The method according to claim 1, wherein
    the insulating layers and the conductive layers are etched in a state where electric power is applied to the substrate.

15. The method according to claim 1, wherein
    the conductive layers are processed into a staircase pattern by repeating the slimming of the resist film and the etching one by one the insulating layers and conductive layers exposed from the resist film.

16. The method according to claim 15, further comprising:
    forming an interlayer insulating layer above a staircase structure of the conductive layers;
    forming a plurality of contact holes punched through the interlayer insulating layer and reaching the conductive layers at each step in the staircase structure; and
    providing contact electrodes in the respective contact holes.

17. The method according to claim 16, further comprising:
    forming a stopper layer on the staircase structure, the stopper layer being made of a material different from a material of the interlayer insulating layer, and wherein
    the interlayer insulating layer is formed on the stopper layer, and
    the plurality of contact holes are punched through the interlayer insulating layer and the stopper layer to reach the conductive layers at each step in the staircase structure.

18. The method according to claim 16, wherein
    the plurality of contact holes are formed all at once in one etching process.

19. The method according to claim 1, further comprising:
    forming a memory hole punched through the stacked body;
    forming an insulating film containing a charge storage film on a side wall of the memory hole; and
    forming a channel body at an inner side of the insulating film in the memory hole.

20. The method according to claim 1, further comprising:
    forming a back gate above the substrate;
    forming a concave portion in the back gate;
    filling the concave portion with a sacrificial film, the filling of the concave portion being followed by the forming of the stacked body;
    forming a plurality of holes punched through the stacked body formed above the back gate and reaching the sacrificial film;
    removing the sacrificial film through the holes to form a U-shaped memory hole having the concave portion and a pair of adjacent holes coupled to each other;
    forming an insulating film containing a charge storage film on a side wall of the memory hole; and
    forming a channel body at an inner side of the insulating film in the memory hole.

* * * * *